United States Patent [19]

Schaaf

[11] Patent Number: 4,755,674
[45] Date of Patent: Jul. 5, 1988

[54] INFRARED DETECTOR

[75] Inventor: Norbert Schaaf, Wiesbaden, Fed. Rep. of Germany

[73] Assignee: Heimann GmbH, Fed. Rep. of Germany

[21] Appl. No.: 912,044

[22] Filed: Sep. 26, 1986

[30] Foreign Application Priority Data

Oct. 8, 1985 [DE] Fed. Rep. of Germany ....... 3535919

[51] Int. Cl.$^4$ ............................................... G01J 5/10
[52] U.S. Cl. .............................. 250/338.1; 250/252.1; 340/567; 340/600
[58] Field of Search ...... 250/338 R, 338 PY, 338 SE, 250/252.1, 349; 340/567, 600

[56] References Cited

U.S. PATENT DOCUMENTS

| 4,441,023 | 4/1984 | Doctor et al. | 250/338 |
| 4,464,575 | 8/1984 | Cholin et al. | 250/252.1 |
| 4,636,643 | 1/1987 | Nakamurz et al. | 250/338 |
| 4,677,294 | 6/1987 | Spector et al. | 250/252.1 |

FOREIGN PATENT DOCUMENTS 0066370 12/1982 European Pat. Off. .
0078443 5/1983 European Pat. Off. .
WO83/00558 2/1983 PCT Int'l Appl.
2141228 12/1984 United Kingdom .

Primary Examiner—Bruce C. Anderson
Assistant Examiner—Paul A. Guss
Attorney, Agent, or Firm—Hill, Van Santen, Steadman & Simpson

[57] ABSTRACT

An infrared detector has at least one infrared-sensitive detector element and at least one infrared source disposed in a common housing with the detector, with the infrared radiation from the source being directed onto the detector element. A pulse generator is connected to the infrared source for pulsing the infrared radiation therefrom. A recognition circuit is connected to the detector element for identifying the pulse sequence of the detector output so as to continuously check the functioning of the detector. A number of such detector elements can be arranged in the housing, with each detector element having a respective infrared source associated therewith. The infrared source may be a heated wire, a chip resistor, or a light emitting diode.

5 Claims, 2 Drawing Sheets

INFRARED DETECTOR

BACKGROUND OF THE INVENTION

1. Field of the Invention

The present invention relates to infrared detectors, and in particular to an infrared detector with means for continually checking the proper functioning of the detector.

2. Description of the Prior Art

One of the principle demands made on alarm systems, such as fire alarm systems, in which infrared detectors are used, is the requirement that the system and/or the individual components thereof be self-monitoring to a large extent. This requirement is in addition to reliability against false alarms and simple operation of the system. In active alarm systems, self-monitoring of the detectors is easily established. An outage results in an alarm at a reception element. In passive systems, for example, in a unit having an infrared transmitter and an infrared detector, an outage of the detector element is recognized by the electronic circuitry connected thereto when no output signal of the detector element is generated when the transmitter is energized, such as by a pulse generator.

Conventional infrared sensing units generally operate as follows. A pyro-electric detector element is connected to a field effect transistor as a source follower in order to reduce the high output impedance of the detector element, which is on the order of magnitude of $10^{13}$ ohms. In order to be electronically processable an impedance on the order of magnitude of 5K ohms is needed, and is obtained by the aforementioned transistor. In such a circuit, an offset voltage on the order of magnitude of 1 V is established at the signal output of the field effect transistor. If damage to the crystal receiver material or ceramic receiver material occurs, for example, due to broken wire leads, the offset voltage at the output does not change. This is the most frequent cause of error which may occur because improper handling, i.e., dropping or striking of the unit, can easily lead to a breakage of the connecting wires in the unit. For conventional sensing units, the unit can be checked for continuing functionability by a user of the alarm system making a walk-in test, i.e., the user moves within the optical receiving region of the alarm and thus intentionally triggers an alarm signal. If under such circumstances an alarm signal is not triggered, it is assumed that the detector (as the receiving element) or the electronic circuitry, is defective. This method is rather involved and time-consuming, and of course, cannot be undertaken when the user is absent. The continuing functioning of the system, however, must be guaranteed above all when the user is absent.

SUMMARY OF THE INVENTION

It is an object of the present invention to provide an infrared detector unit capable of continuous monitoring of the functioning of the unit and having a reliable alarm output.

The above object is achieved in accordance with the principles of the present invention in an infrared detector unit having two detector elements, with an infrared source being allocated to each of the detector elements.

The detector unit thus operates completely independently of any optics which may be present between the infrared source and the associated detector element, and also operates completely independently of the environment in which the detector unit is situated. The inventive concept disclosed herein can be used to monitor any type of detector element which reacts to thermal radiation. Each infrared source is activated in a specific chronological sequence for a defined length of time on the order of magnitude of one second, and thus causes a signal to be generated in the corresponding detector element which permits a check thereof to be made. The use of two detector elements ensures reliable alarm generation. A current pulse of approximately 1 ma having a duration of approximately 0.6 seconds is sufficient, for example, to generate a signal of 2 mV at the detector element output. In general, switching thresholds in infrared alarm devices are approximately 2.00 $\mu$V, so that the above signal (200 $\mu$V) is adequate. The shape of the signal which drives the infrared source is of no significance.

DESCRIPTION OF THE PREFERRED EMBODIMENTS

Figure 1:
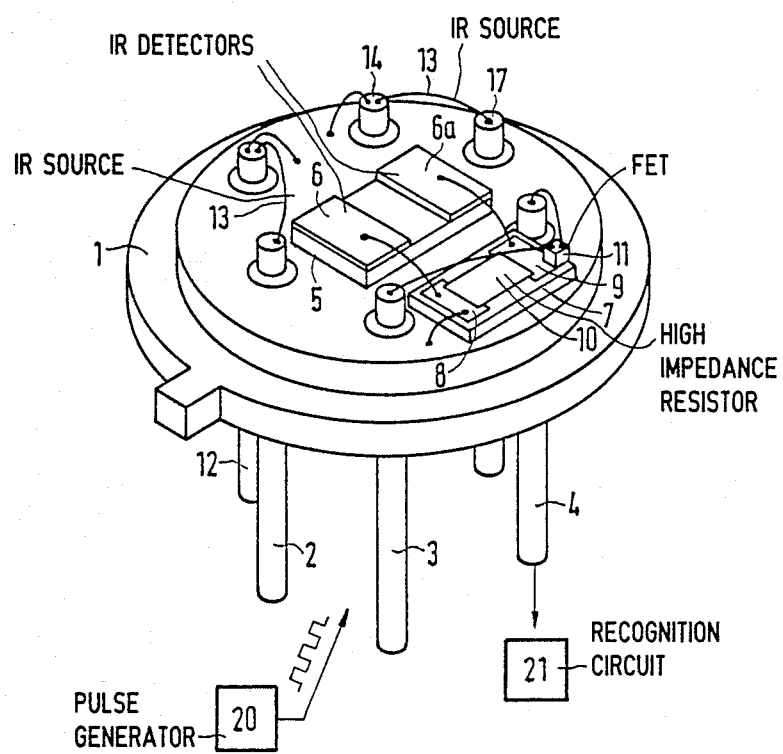
FIG. 1 is a perspective view of an infrared detector unit constructed in accordance with the principles of the present invention with the housing cover removed, and schematically showing associated electronic circuitry.
Figure 2:
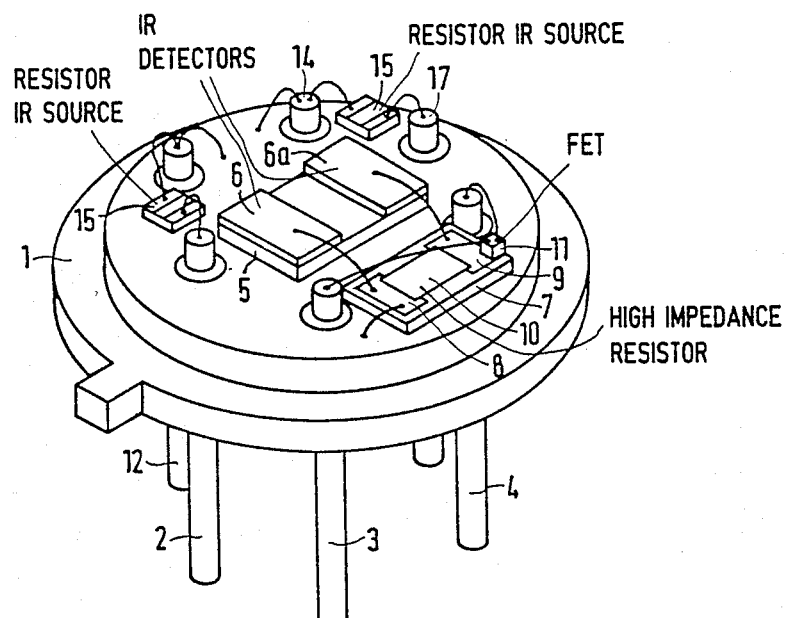
FIG. 2 is a perspective view of a further embodiment of an infrared detector unit constructed in accordance with the principles of the present invention with a different type of infrared source.
Figure 3:
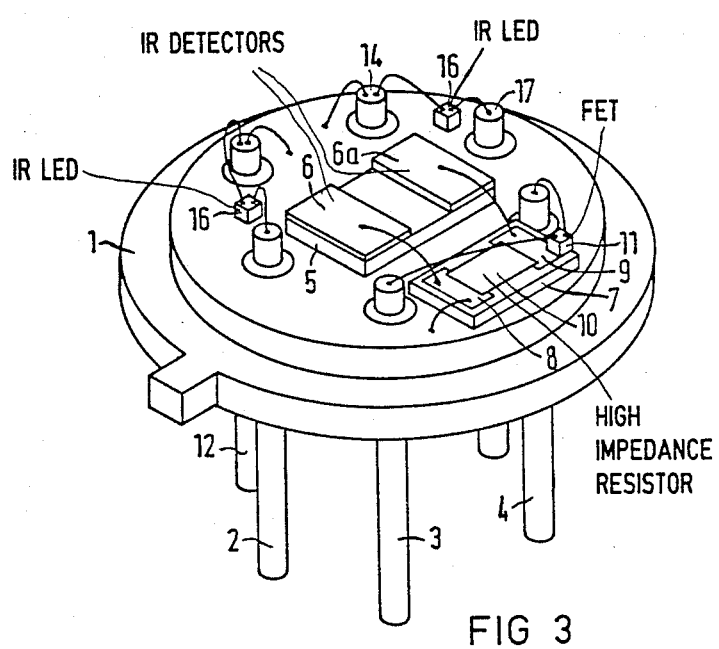
FIG. 3 is a perspective view of another embodiment of an infrared detector unit constructed in accordance with the principles of the present invention with still another type of infrared source.

FIGS. 1 through 3 show various embodiments of an infrared detector unit constructed in accordance with the principles of the present invention, with the cover of the housing removed. The unit includes a base plate 1 with a plurality of terminal pins 2, 3, 4, 12, 14 and 17 extending downwardly therefrom. Two detector elements 6 and 6a are attached to the upper side of the base plate 1 on a plastic plate 5. Another plastic insulating plate 7 is disposed on the base plate 1, spaced from the plate 5. The plate 7 has spaced conductive tracks 8 and 9 thereon, which are respectively electrically connected to the detectors 6 and 6a by lead wires. A high-impedance resistor 10 is disposed between the conductive tracks 8 and 9. A field effect transistor 11 is also mounted on the conductive track 9. An output electrode of the field effect transistor 11 is connected to the terminal 4, and another electrode in the output path of the field effect transistor 11 is connected to the terminal 3. The conductive track 8 is connected to the base plate 1.

In each of the embodiments, an infrared source is connected between terminal pins 12 and 2, and another infrared source is connected between terminal pins 14 and 17. The terminal pins 14 and 12 are also connected to the base plate 1. A pulse generator 20 supplies a selected sequence of pulses to the terminal 14. The infrared source between the terminals 12 and 2 is disposed for directing infrared radiation onto the detector 6, and the infrared source disposed between the terminal pins 14 and 17 is arranged for directing infrared radiation onto the detector 6a.

In the embodiment of FIG. 1, the infrared sources are resistance wires 13. In the embodiment of FIG. 2, the infrared sources are two chip resistors 15. In the embodiment of FIG. 3, the infrared sources are two light emitting diodes 16.

In all of the above embodiments, the radiation from the infrared sources is pulsed by the pulse generator 20, and the output signal from the detector elements 6 and 6a is transmitted to a recognition circuit 21. The recognition circuit 21 determines whether signals corresponding to the periodic pulses of the pulse generator 20 have been generated by the detectors 6 and 6a. If a fault is present in either detector elements 6 or 6a, this is identified by the recognition circuit 21, and a corresponding fault signal can be generated.

Although modifications and changes may be suggested by those skilled in the art it is the intention of the inventor to embody within the patent warranted hereon all changes and modifications as reasonably and properly come within the scope of his contribution to the art.

I claim as my invention:

1. An infrared sensor unit for use with a pulse generator and a recognition circuit, comprising:
    first and second separate infrared sources driven by said pulse generator to emit pulsed infrared radiation;
    first and second separate infrared detectors disposed for respectively receiving said pulsed infrared radiation emitted by said first and second infrared sources; and
    means connected to said first and second infrared detectors and to said recognition circuit for generating an electrical signal from said first and second infrared detectors and supplying said signal to said recognition circuit, said electrical signal corresponding to the signal from said pulse generator driving said infrared sources when said first and second infrared detectors are functioning properly.

2. An infrared sensor unit as claimed in claim 1, wherein said first and second infrared sources are resistance wires.

3. An infrared sensor unit as claimed in claim 1, wherein said first and second infrared sources are resistor chips.

4. An infrared sensor unit as claimed in claim 1, wherein said first and second infrared sources are light emitting diodes.

5. An infrared sensor unit as claimed in claim 1, whrein said means for generating an electrical signal comprises:
    first and second conductor tracks respectively connected to said first and second infrared detectors;
    a high impedance resistor connected between said first and second conductor tracks; and
    a transistor connected between one of said conductor tracks and said recognition circuit.

* * * * *